United States Patent
Chau et al.

(10) Patent No.: US 6,777,759 B1
(45) Date of Patent: Aug. 17, 2004

(54) DEVICE STRUCTURE AND METHOD FOR REDUCING SILICIDE ENCROACHMENT

(75) Inventors: Robert S. Chau, Beaverton, OR (US); Ebrahim Andideh, Portland, OR (US); Mitch C. Taylor, Lake Oswego, OR (US); Chia-Hong Jan, Portland, OR (US); Julie Tsai, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/654,315

(22) Filed: Sep. 1, 2000

Related U.S. Application Data

(62) Division of application No. 09/115,405, filed on Jul. 14, 1998, which is a division of application No. 08/884,912, filed on Jun. 30, 1997.

(51) Int. Cl.$^7$ .................. H01L 29/76; H01L 29/94; H01L 31/062; H01L 31/113; H01L 31/119
(52) U.S. Cl. .................. 257/377; 257/382; 257/384; 257/388; 257/616; 257/412
(58) Field of Search .................. 257/377, 382, 257/384, 388, 412, 616, 19, 900

(56) References Cited

U.S. PATENT DOCUMENTS

| | | | |
|---|---|---|---|
| 4,788,160 A | 11/1988 | Havemann et al. | |
| 4,851,257 A | 7/1989 | Young et al. | |
| 5,089,872 A | 2/1992 | Ozturk et al. | |
| 5,168,072 A | 12/1992 | Moslehi | |
| 5,242,847 A | 9/1993 | Ozturk et al. | |
| 5,314,832 A | 5/1994 | Deleonibus | |
| 5,336,903 A | 8/1994 | Ozturk et al. | |
| 5,338,698 A | 8/1994 | Subbanna | |
| 5,453,389 A | 9/1995 | Strain et al. | |
| 5,571,744 A | 11/1996 | Demirlioglu et al. | |
| 5,618,755 A | 4/1997 | Ito | |
| 5,665,646 A | 9/1997 | Kitano | |
| 5,686,331 A | 11/1997 | Song | |
| 5,702,972 A | 12/1997 | Tsai et al. | |
| 5,707,721 A | 1/1998 | Jang | |
| 5,710,450 A | 1/1998 | Chau et al. | |
| 5,716,861 A | 2/1998 | Moslehi | |
| 5,763,932 A | 6/1998 | Pan et al. | |
| 5,793,089 A | * 8/1998 | Fulford et al. | ............. 257/408 |
| 5,851,891 A | 12/1998 | Dawson et al. | |
| 6,087,706 A | 7/2000 | Dawson et al. | |
| 6,124,189 A | 9/2000 | Watanabe et al. | |
| 6,165,826 A | * 12/2000 | Chau et al. | ................. 438/226 |

FOREIGN PATENT DOCUMENTS

JP          05-090517          4/1993

OTHER PUBLICATIONS

Achutharaman, Raman, et al., Selective CVD of Titanium Silicide For Raised Source/Drains, Semiconductor International, Oct. 1996, pp. 149,150 and 152.

* cited by examiner

*Primary Examiner*—Thien F Tran
(74) *Attorney, Agent, or Firm*—Blakely, Sokoloff, Taylor & Zafman LLP

(57) ABSTRACT

A semiconductor device having a novel spacer structure and method of fabrication. The present invention describes a semiconductor device which has an electrode with a first thickness. A silicide layer having a second thickness is formed on the electrode. A sidewall spacer which is formed adjacent to the electrode has a height which is greater than the sum of the thickness of the electrode and the thickness of the silicide layer.

5 Claims, 12 Drawing Sheets

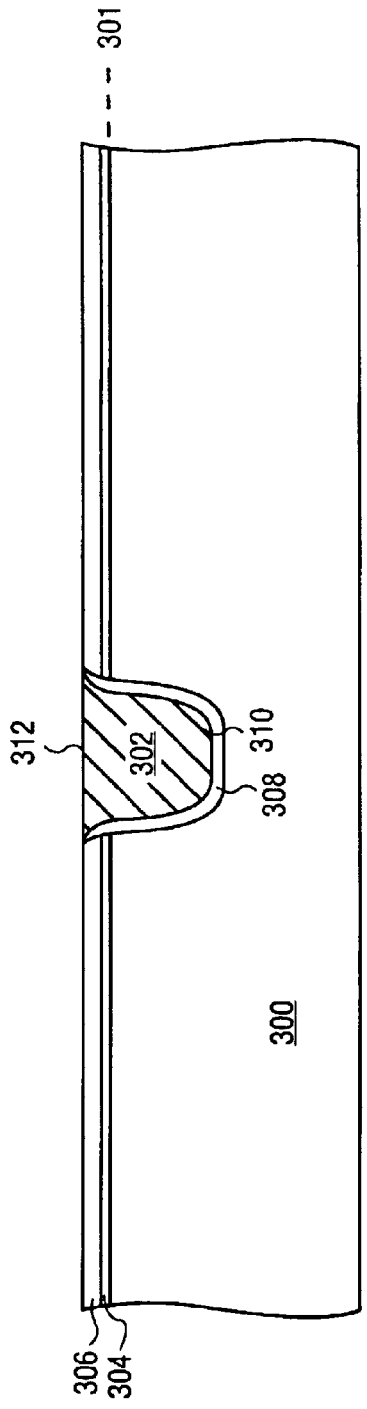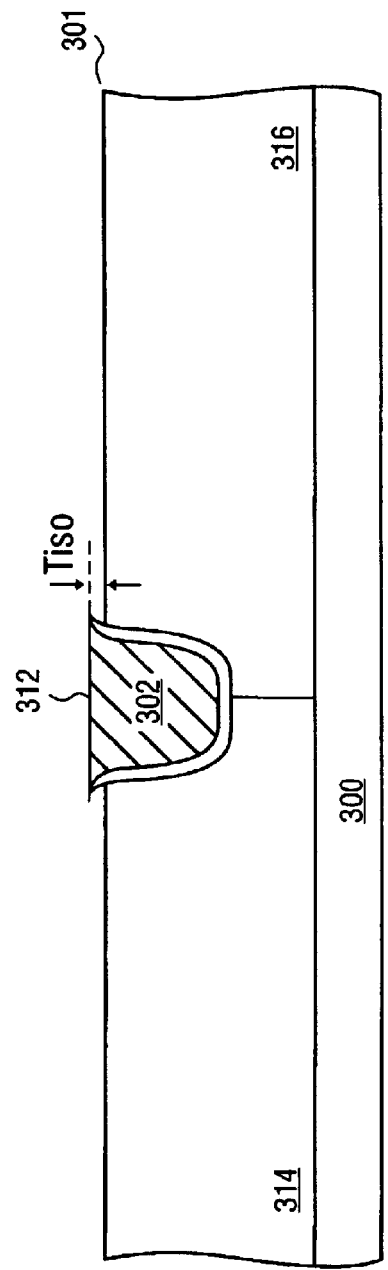

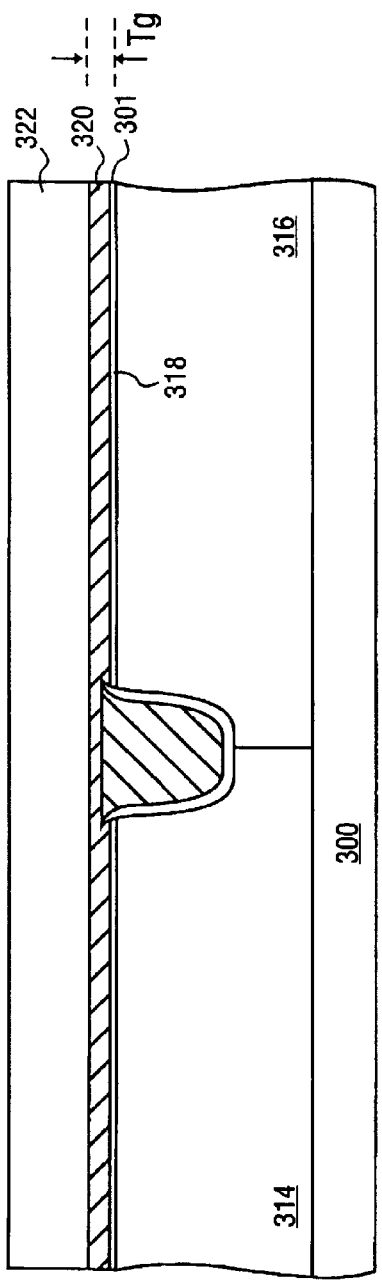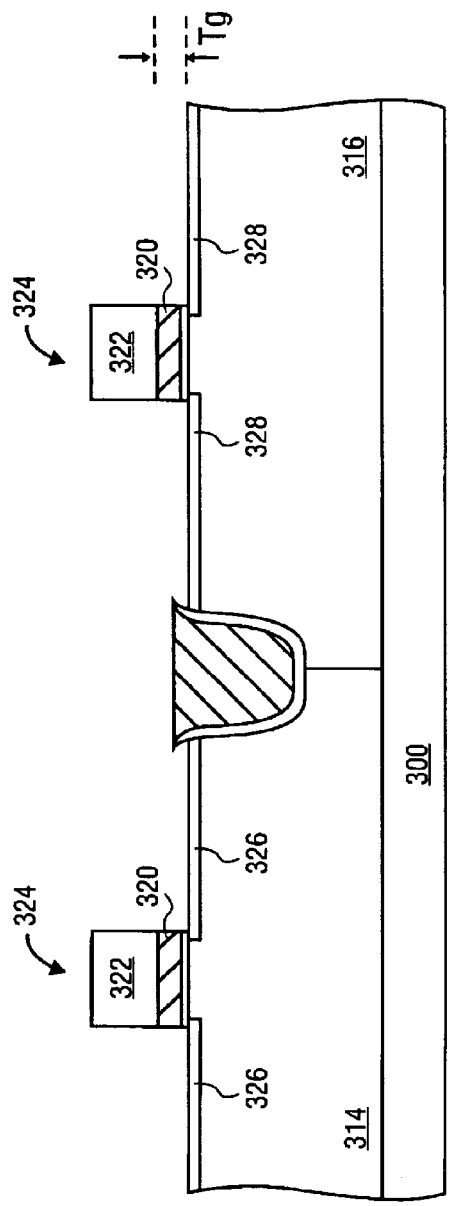

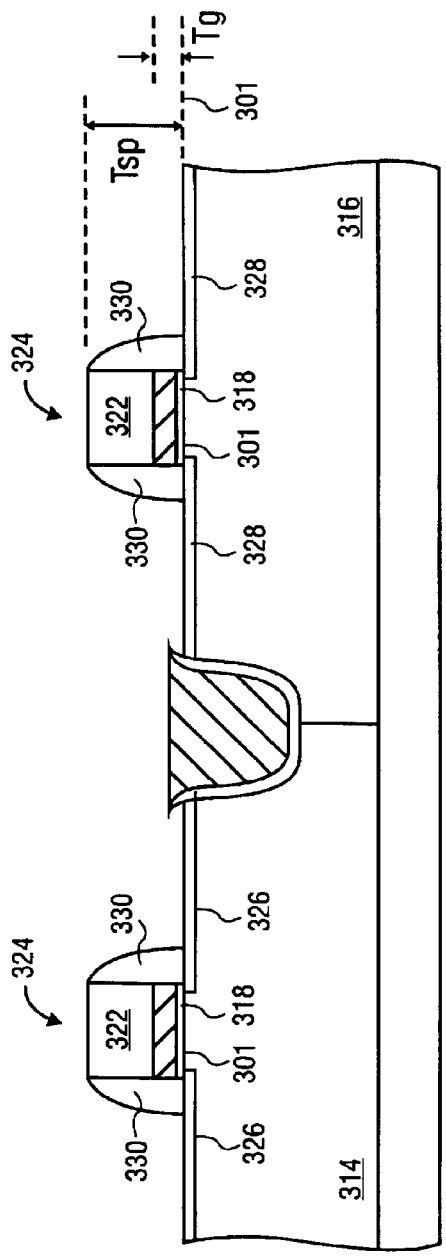
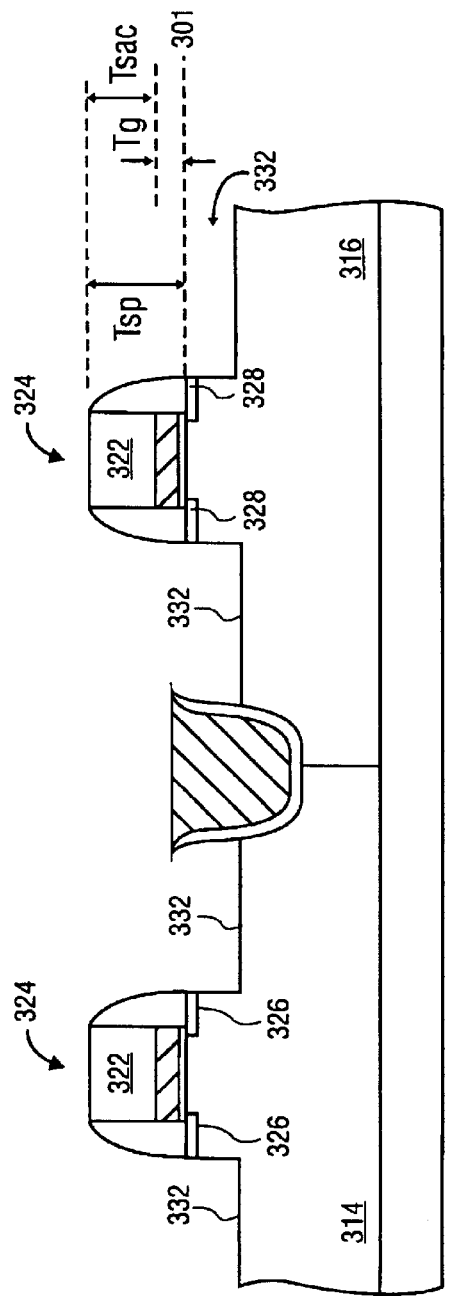
FIG. 3E
FIG. 3F

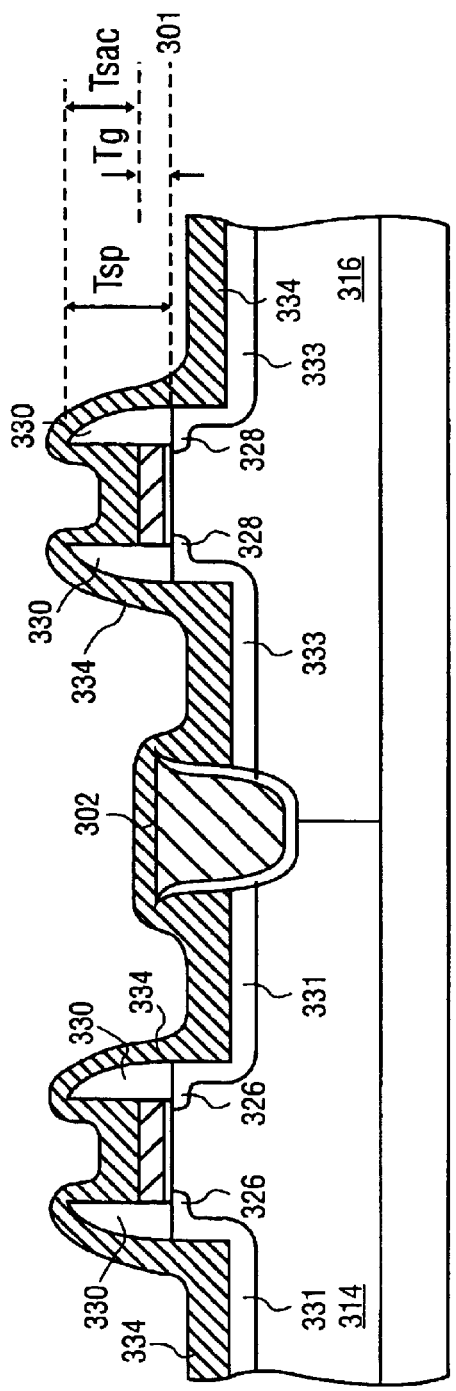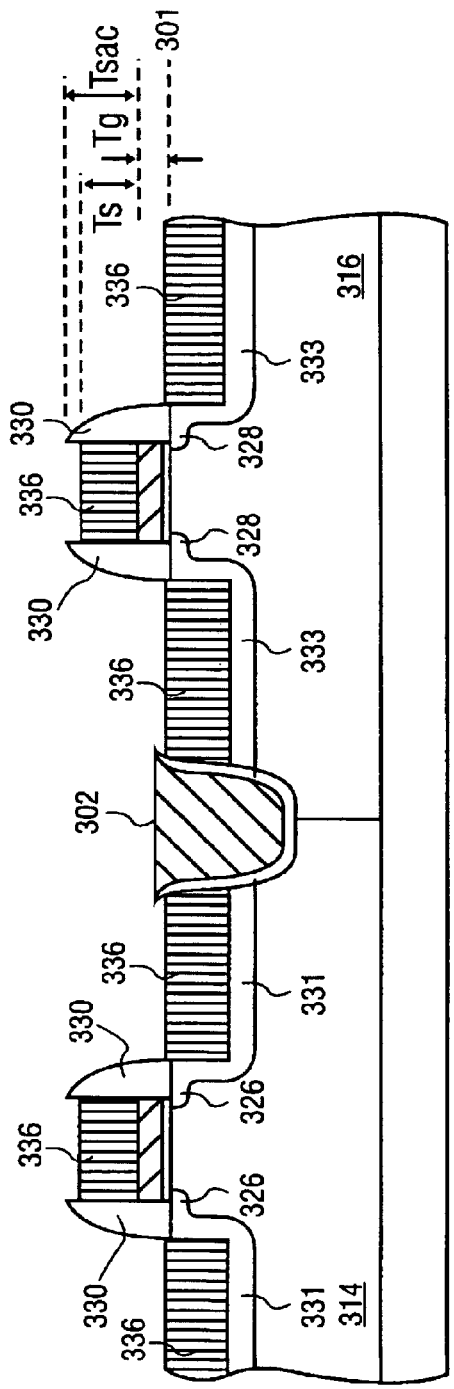
FIG. 3H
FIG. 3I

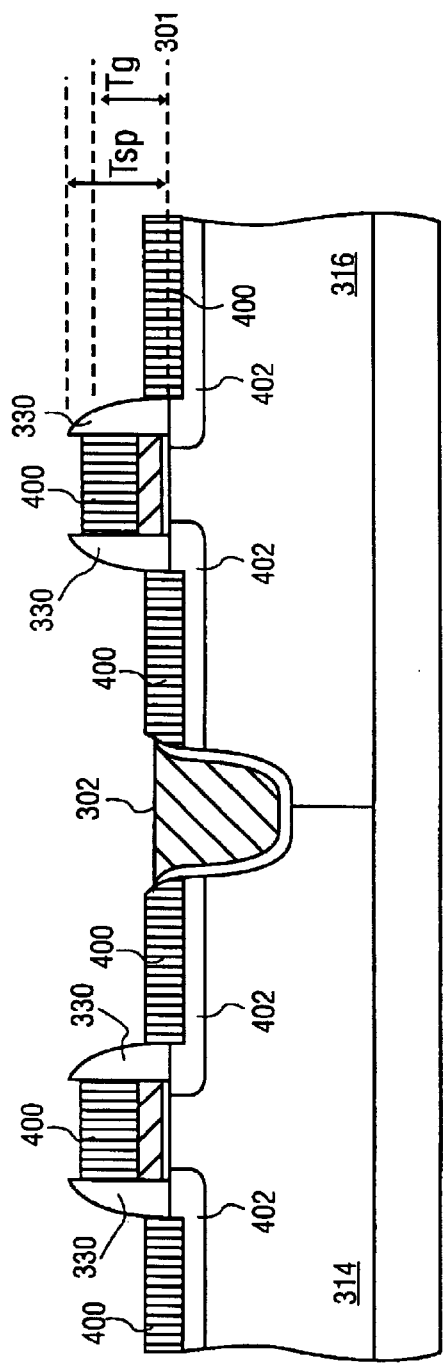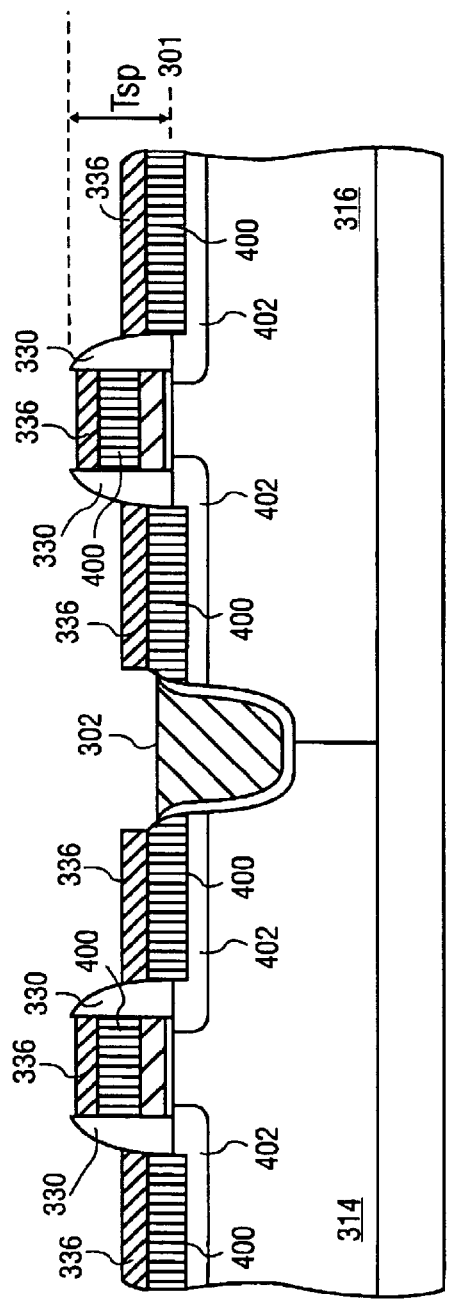
FIG. 4A
FIG. 4B

DEVICE STRUCTURE AND METHOD FOR REDUCING SILICIDE ENCROACHMENT

This is a Divisional Application of Ser. No. 09/115,405 filed on Jul. 14, 1998 which is a Divisional Application of Ser. No. 08/884,912 filed on Jun. 30, 1997.

BACKGROUND OF THE INVENTION

1. Field of the Invention

The present invention relates to the field of semiconductor device fabrication, and more specifically to a method and structure for reducing silicide encroachment in an integrated circuit.

2. Discussion of Related Art

Today integrated circuits are made up of literally millions of active and passive devices such as transistors, capacitors, and resistors. In order to improve device performance, low resistance silicide layers are generally formed on electrodes such as gate electrodes and on doped regions such as source/drain regions.

For example, FIG. 1A is an illustration of a portion of a complementary metal oxide semiconductor (CMOS) integrated circuit. Integrated circuit 100 includes a PMOS transistor 102 and an NMOS transistor 104 separated by an isolation region 103. NMOS and PMOS transistor 102 and 104 each include a pair of source/drain regions 106, a polysilicon gate electrode 107, and a gate dielectric layer 101. Insulative sidewall spacers 108 are formed along opposite sidewalls of gate electrode 107 as shown in FIG. 1A. In order to decrease the resistance of gate electrode 107 and source/drain regions 106, low resistance silicide is formed on gate electrode 107 and source/drain regions 106.

One method of forming a low resistance silicide is a self-aligned silicide process known as a SALICIDE process. In such a process, a refractory metal layer 109, such as titanium, tungsten, cobalt, nickel or palladium, is blanket deposited over the substrate and MOS devices 102 and 104 as shown in FIG. 1B. The substrate is then heated to cause a reaction between metal layer 109 and exposed silicon surfaces such as source/drain regions 106 and gate electrode 107 to form a low resistance silicide 110 as shown in FIG. 1C. Locations where no silicon is available for reaction, such as oxide spacers 108 and isolation region 103, metal layer 109 remains unreacted. Unreacted metal 109 can then be etched away leaving silicide only on source/drain regions 106 and on gate electrode 107 as shown in FIG. 1D.

A problem with the above described process is that circuits fabricated with the process are vulnerable to short circuits due to silicide encroachment. That is, during the high temperature anneal used to form silicide layer 110 or during subsequent anneal steps, silicide can diffuse or spill over from polysilicon gate electrode 107 and source/drain regions 106 and form an undesired silicide bridge 112 over sidewall spacers 108 and cause shorting of gate electrode 107 to source/drain region 106. Silicide encroachment is further compounded by silicides, such as nickel silicide (NiSi), which experience silicide volume increases over the combined volume of the consumed silicon and metal layer. For example, the reaction of nickel and silicon creates a nickel silicide/polysilicon gate electrode layer having an approximately 18% volume increase over the silicon electrode shown in FIG. 1A. As such is shown in FIG. 1C to silicide 110 reaches above spacer 108.

Silicide encroachment can also cause short circuits between source/drain regions of adjacent devices which are separated by planar isolation regions. For example, as also shown in FIG. 1E, as isolation regions are made more planar and made more compact (less than 0.4 microns wide), such as with shallow trench isolation (STI), silicide from adjacent transistor source/drain regions 106 can diffuse or spill over isolation region 103 and cause silicide shorts 114 between adjacent devices.

In order to help reduce the potential for silicide shorts between source/drain regions and gate electrodes, polysilicon layer 107 is formed thick, (i.e., greater than 2000 Å), in order to ensure that silicide 110 has a large distance to bridge over spacers 108. Unfortunately, however, by increasing the thickness of polysilicon gate 107, the ion implantation technique used to dope gate electrode 107 (typically the source/drain implantation) is unable to drive dopants sufficiently deep into the electrode 107 to provide a uniformly doped low conductivity gate electrode. When the lower portion (portion near gate dielectric layer 101) of the gate electrode has no or reduced doping, the device has increased gate resistance which detrimentally affects the drive current. This non uniform gate electrode doping is commonly referred to as "polysilicon depletion effects".

Additionally, in order to prevent silicide encroachment, silicide layer 110 is generally kept thin (i.e., thinner than the thickness of the polysilicon gate electrode). It would be desirable to be able to form silicide layers which are thicker than the polysilicon layer so that lower resistance electrodes can be fabricated and device performance improved.

Thus, what is desired is a device structure and method of fabrication which reduces silicide encroachment as well as poly depletion effects.

SUMMARY OF THE INVENTION

In a first embodiment of the present invention, a semiconductor device having a novel spacer structure and its method of fabrication is described. According to the first embodiment a semiconductor device having an electrode with a first thickness is formed. A silicide layer having a second thickness is formed on the electrode. A sidewall spacer formed adjacent to the electrode and has a height which is greater than the sum of the thickness of the electrode and the thickness of the silicide layer. In another embodiment of the present invention, regions of a device which are to receive silicide are etched below the top surface of isolation regions prior to silicide deposition. In this way silicide regions are formed below the top surface of the isolation regions.

BRIEF DESCRIPTION OF THE DRAWINGS

FIG. 3A is an illustration of a cross-sectional view showing the formation of a isolation region in a semiconductor substrate.

FIG. 3B is an illustration of a cross-sectional view showing the formation of p type and n type conductivity regions in a semiconductor substrate.

FIG. 3C is an illustration of a cross-section view showing the formation of a gate dielectric layer, a polysilicon layer, and a sacrificial layer on the substrate of FIG. 3B.

FIG. 3D is an illustration of a cross-sectional view showing the formation of an intermediate gate electrode on the substrate of FIG. 3C.

FIG. 3E is an illustration of a cross-sectional view showing the formation of sidewall spacers on the substrate of FIG. 3D.

FIG. 3F is an illustration of a cross-sectional view showing the formation of recesses and source/drain regions in the substrate of FIG. 3E.

FIG. 3H is an illustration of a cross-sectional view showing the formation of a metal layer over the substrate of FIG. 3G.

FIG. 3I is an illustration of a cross-sectional view showing the formation of silicide regions.

FIG. 4A is an illustration of a cross-sectional view showing the formation of semiconductor material onto a semiconductor substrate.

FIG. 4B is an illustration of a cross-sectional view showing the formation of silicide on the substrate of FIG. 4A.

DETAILED DESCRIPTION OF THE PRESENT INVENTION

A novel device structure and method for preventing silicide encroachment is described. In the following description numerous specific details are set forth such as specific materials and processes in order to provide a thorough understanding of the present invention. In other instances well known semiconductor processing techniques and machinery have not been set forth in detail in order to not unnecessarily obscure the present invention.

The present invention is a novel device structure and method for preventing silicide encroachment in an integrated circuit. In one embodiment of the present invention a sidewall spacer is formed adjacent to an electrode of a device onto which a silicide layer is to be formed. The spacer is fabricated so that it has a height which is greater than the combined thickness or height of the electrode plus the silicide layer. In this way the spacer extends above the height of the silicided electrode and prevents silicide from expanding or diffusing from the electrode and causing shorts with adjacent devices or regions.

In another embodiment of the present invention where isolation regions are used to isolate adjacent devices, devices are fabricated in such a manner that the isolation region extends above the silicided regions. According to this embodiment of the present invention, regions which are to receive silicide are etched below the top surface of the isolation region prior to silicide deposition. In this way, silicide is unable to expand or diffuse over the isolation region and cause electrical coupling or shorts between adjacent devices.

Figure 1A:
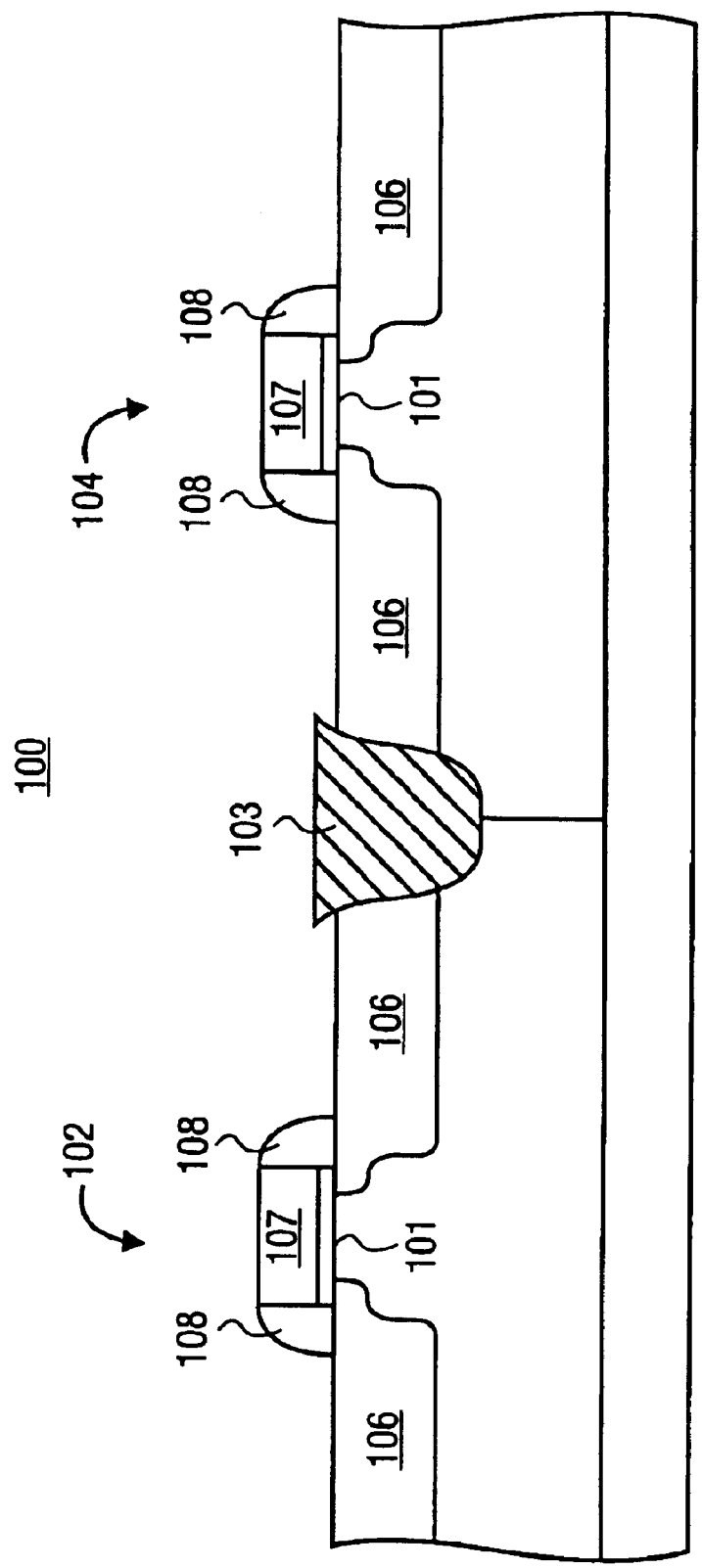
FIG. 1A is an illustration of a cross-sectional view of a conventional CMOS integrated circuit.
Figure 1B:
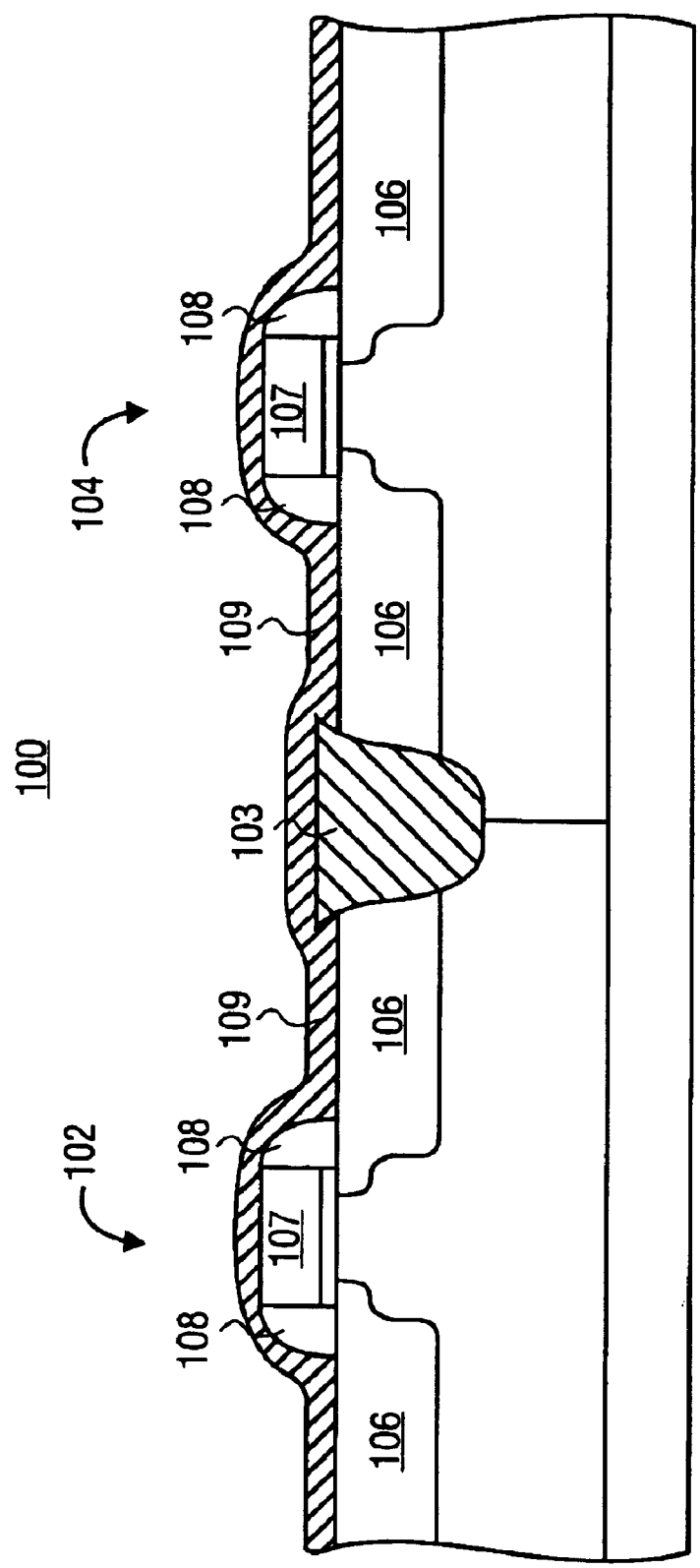
FIG. 1B is an illustration of a cross-sectional view showing the formation of a metal layer over the substrate at FIG. 1A.
Figure 1C:
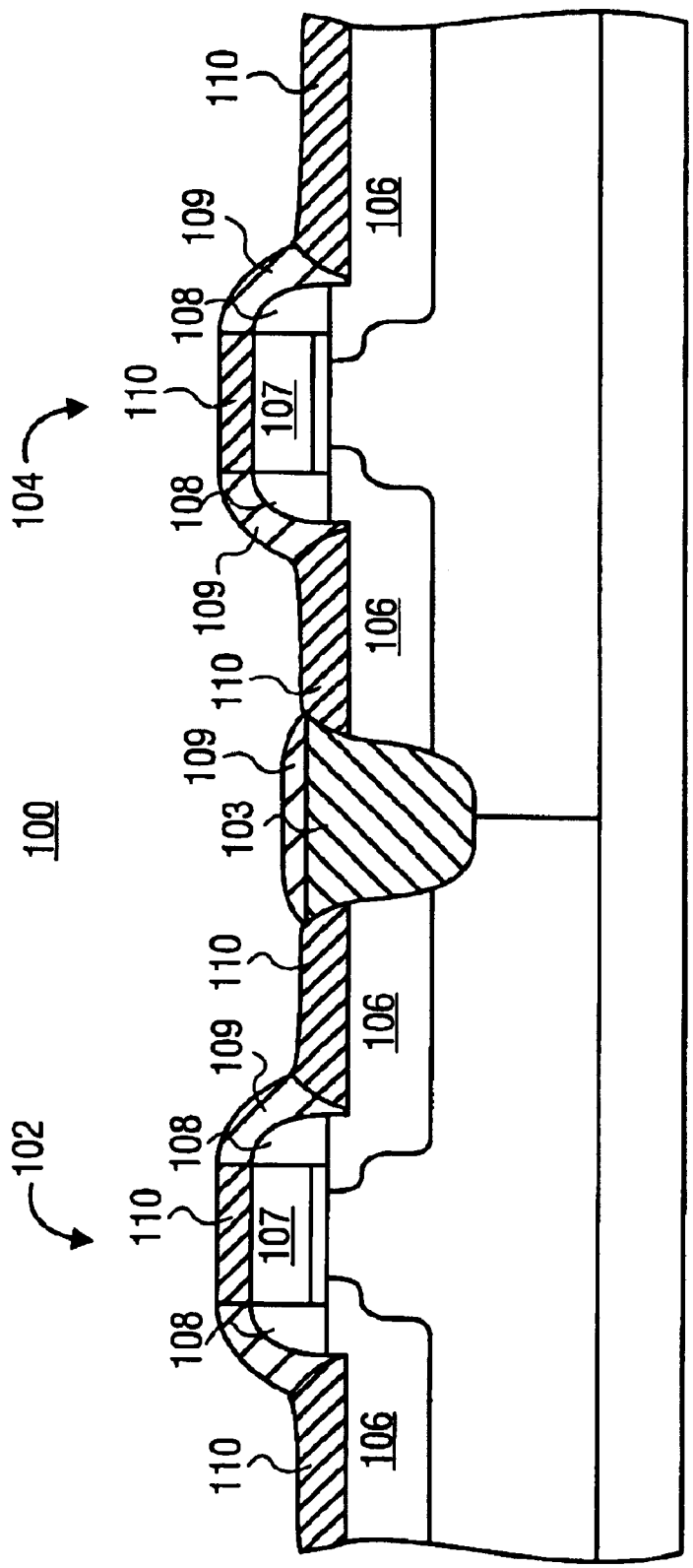
FIG. 1C is an illustration of a cross-sectional view showing the formation of a silicide layer from the metal layer on the substrate at FIG. 1B.
Figure 1D:
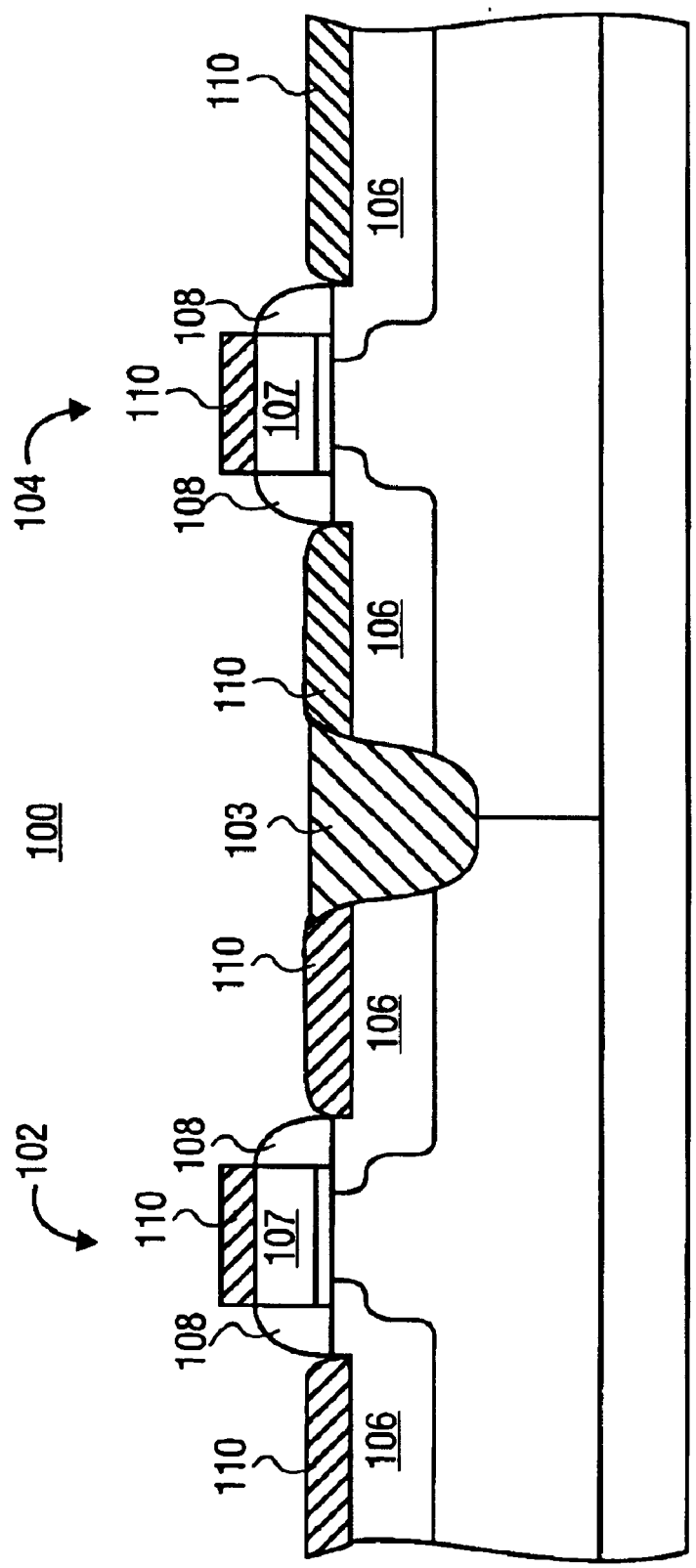
FIG. 1D is an illustration of a cross-sectional view showing the removal of unreacted metal from the substrate of FIG. 1C.
Figure 1E:
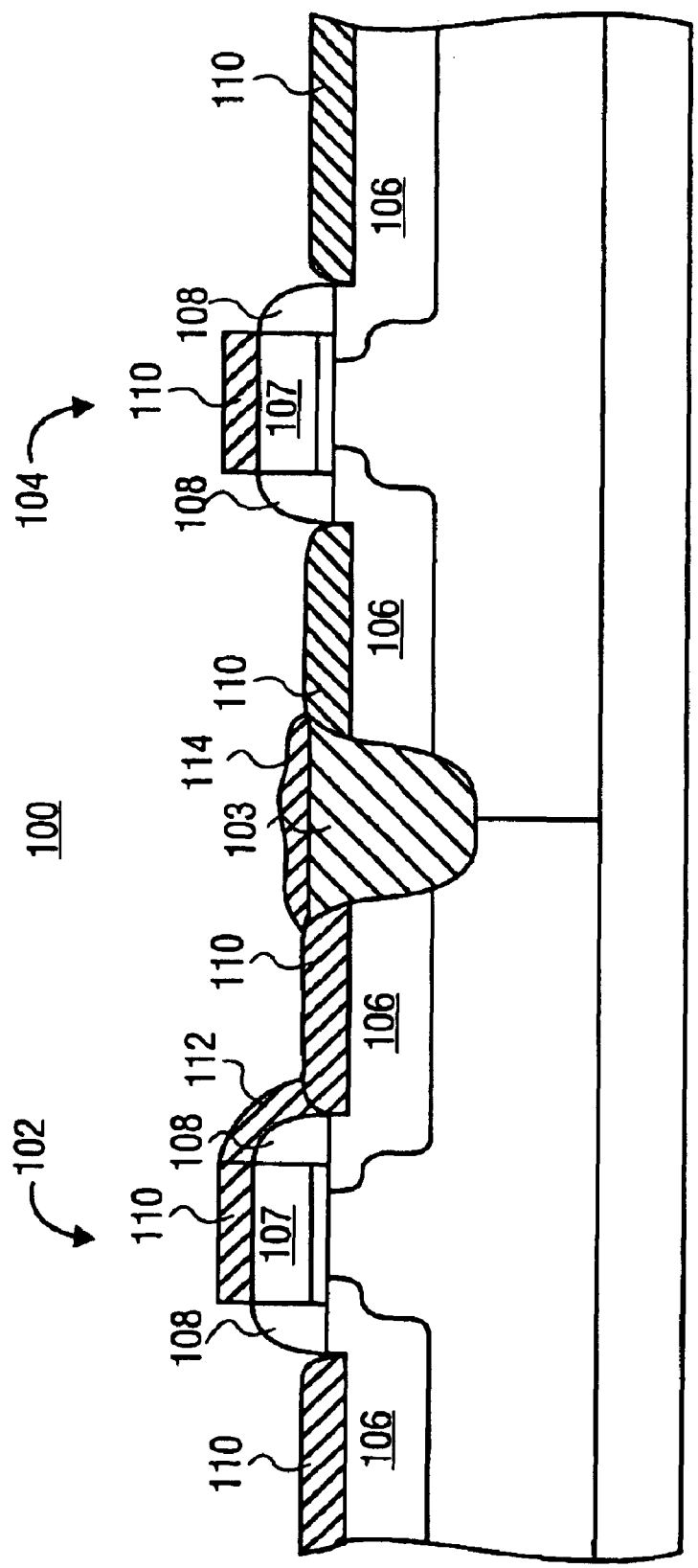
FIG. 1E is an illustration of a cross-sectional view showing silicide encroachment on the substrate of FIG. 1D.
Figure 2:
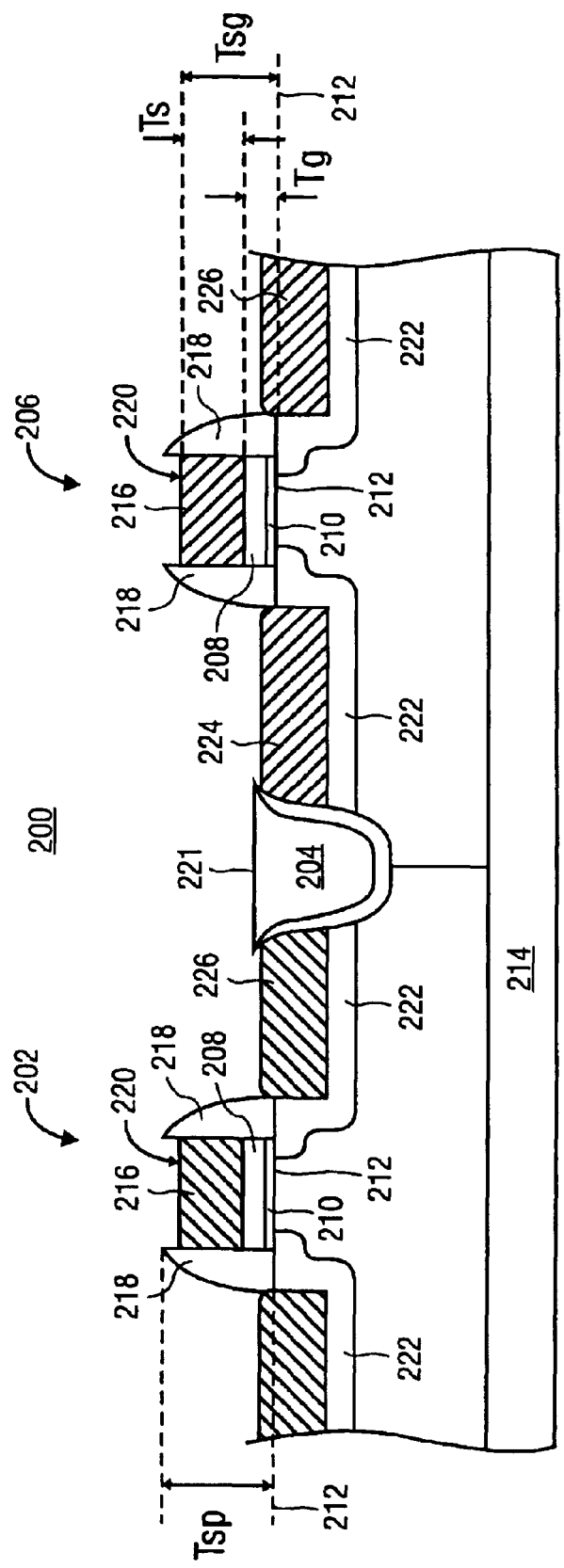
FIG. 2 is an illustration of a cross-sectional view of a semiconductor substrate having silicide regions formed in accordance with the present invention.

An example of an integrated circuit 200 which incorporates the structures and methods of the present invention is illustrated in FIG. 2. Integrated circuit 200 includes a first metal oxide semiconductor device 202 and a second metal oxide semiconductor device 206 separated by an isolation region 204. Each MOS device includes a gate electrode 208 formed on a gate dielectric layer 210 which is formed on a first surface 212 of a substrate 214. Each gate electrode has a silicide layer 216 formed thereon. Semiconductor devices 202 and 206 each also include a pair of sidewall spacers 218 formed adjacent to and along opposite sides of the silicided gate electrodes 220 as shown in FIG. 2. Sidewall spacers 218 extend a spacer height ($T_{sp}$) above substrate surface 212. Spacers 218 have a height ($T_{sp}$) which is greater than the height ($T_{sg}$) which the silicided gate electrode 220 extends above substrate surface 212 (i.e., $T_{sp} > T_{sg}$). That is, spacer height ($T_{sp}$) is greater than the sum total of the gate electrode 208 thickness ($T_g$) and the silicide 216 thickness ($T_s$) (i.e., $T_{sp} > T_g + T_s$). Spacers 218 preferably extend at least 200 Å above silicided gate electrode 220. Additionally, in an embodiment of the present invention, silicide layer 216 can be made much thicker, more than two times thicker, than the gate electrode 208. (i.e., $T_s > T_g$) In this way gate electrode resistance is substantially reduced and poly depletion effects eliminated.

In another embodiment of the present invention, integrated circuit 200 utilizes planar isolation regions 204, such as, shallow trench isolation (STI), as shown in FIG. 2. A planar isolation region 204 is characterized by the fact that the top surface 221 of isolation region 204 is substantially planar with substrate surface 212 on which gate dielectric layers 210 are formed. That is, the top surface 221 of isolation region 204 extends less than 1500 Å above substrate surface 212. Shallow trench isolation regions are desirable because they can be formed planar and compact which dramatically improves device packing density. In the embodiment of the present invention where planar isolation regions (e.g., STI) are utilized, source/drain regions 222 are etched or recessed prior to depositing silicide 224 on to the source/drain regions. In this way, the top surface 221 of isolation region 204 extends above the top surface 226 of silicide regions 224. In this way silicide is confined to the source/drain regions and is prevented from diffusing or expanding over the isolation region 204 and causing short circuits between the source/drain regions 224 of adjacent devices 202 and 206.

An example of a method of fabricating an integrated circuit according to methods of the present invention will be described with respect to the fabrication of a CMOS integrated circuit The example describes a method of preventing silicide encroachment and thereby preventing shorts between a source/drain region and a gate electrode when forming a silicide on the gate electrode. Additionally the present example illustrates a method of preventing silicide encroachment between source/drain regions of adjacent transistors separated by a planar isolation region. The methods described herein can be used independently or integrated together to reduce or eliminate reliability issues associated with silicide encroachment. It is to be appreciated that the illustrated method of preventing silicide encroachment on a gate electrode is equally applicable to forming silicide layers on other electrodes such as but not limited to emitter electrodes of bipolar transistors and capacitor electrodes of DRAM cells. Similarly the illustrated method of preventing silicide encroachment between source/drain regions of adjacent transistors is equally applicable to preventing silicide encroachment over any isolation region separating other device regions such as base and collector contact regions and burried interconnects. The isolation process is especially useful when planar, compact isolation regions are used.

According to the present invention a substrate 300, such as shown in FIG. 3A, is provided. Substrate 300 is generally a semiconductor substrate such as but not limited to a silicon substrate, a gallium arsenide substrate, a silicon germanium substrate, or a silicon on insulator (SOI) substrate. Additionally substrate 300 may or may not include additional epitaxial layers deposited thereon. Still further substrate need not necessarily be semiconductor substrate and can be other types of substrates such as those used for flat panel displays. For the purposes of the present invention a substrate is defined as a starting material on which devices of the present invention are fabricated.

According to an embodiment of the present invention, an isolation region 302 is formed on substrate 300. In order to fabricate high density integrated circuits, isolation region 302 is preferably a planar isolation region such as a shallow trench isolation (STI). An STI region 302 can be fabricated by a well known technique such as by blanket depositing a pad oxide layer 304 of about 100 Å onto surface 301 of substrate 300 and a nitride layer 306 of about 1000 Å onto pad oxide layer 304. Using standard photolithography and etching techniques, an opening can be formed through pad oxide layer 304 and silicon nitride layer 306 at locations where isolation regions are desired. Substrate 300 is then etched to form a trench in substrate 300 with well known techniques. Next, a thin (approximately 100–300 Å) thermal oxide is grown within the trench. A fill material, such as silicon dioxide deposited by chemical vapor deposition (CVD), is then blanket deposited over silicon nitride layer 306 and into the trench. The fill material can then be polished back with chemical mechanical polishing until the top surface 312 of isolation region 302 is substantially planar with silicon nitride layer 306 as shown in FIG. 3A.

Next, as shown in FIG. 3B, silicon nitride layer 306 and pad oxide layer 304 are removed with well known techniques to form a shallow and compact isolation region 302. Isolation region 302 is said to be a planar isolation region when the top surface 312 of isolation region 302 has a height ($T_{iso}$) which is less than 1500 Å above substrate surface 301. Additionally with the technique described above compact isolation regions having a width of less than 0.4 microns can be fabricated. It is to be appreciated that the use of small and planar isolation regions enables the fabrication of high density integrated circuits. Although STI regions are preferred, other types of planar isolation regions, such as recessed LOCOS and deep trench isolation may be utilized as well as non planar isolation regions, such as LOCOS isolation, if desired.

Next, as also shown in FIG. 3B, well known masking and ion implementation techniques are used to form a p type region 314 and an n type region 316 in substrate 300.

Next, as illustrated in FIG. 3C, a thin, less than 100 Å, gate dielectric layer 318 such as but not limited to silicon dioxide, silicon nitride or silicon oxinitride is formed on surface 301 of substrate 300. A silicon film 320 is then deposited over gate dielectric layer 318 as shown in FIG. 3C. Silicon film 320 is generally polycrystalline silicon but may be other forms of silicon such as amorphous silicon. Polysilicon layer 320 can be planarized at this time by chemical-mechanical polishing. In order to reduce polysilicon depletion effects as well as improve photolithography and etch processes, polysilicon layer 320 is formed as thin as possible. However, polysilicon layer 320 must be formed thick enough to prevent channel doping during subsequent source/drain doping. A planarized polysilicon layer having a thickness ($T_g$) of between 100–1500 Å over substrate surface 301 is suitable. (It is to be noted that gate thickness Tg over substrate surface 301 includes the nominal thickness of gate dielectric layer 318).

Next, as also shown in FIG. 3C, a sacrificial layer 322 is deposited over polysilicon layer 320. Sacrificial layer 320 can be any suitable material which can be selectively etched with respect to subsequently formed spacers and polysilicon layer 320. Sacrificial layer 320 can be for example, a grown or CVD deposited oxide layer, a fluorine, phosphorous, or boron doped oxide layer, formed by any well known technique. Additionally sacrificial layer 320 can be a silicon/germanium semiconductor alloy. A silicon/germanium semiconductor alloy can be formed by a decomposition of $SiH_2Cl_2$ and $GeH_4$ in $H_2$ ambient at a temperature between 500–800° C. with 600° C. being preferred. It is to be appreciated that the thickness of sacrificial layer 322 sets the upper limit on the amount of silicide that can be subsequently formed on polysilicon layer 320. Sacrificial layer 322 is preferably made thicker than polysilicon layer 320 and ideally at least twice as thick. In this way the electrode can have a silicide layer which is thicker than the polysilicon layer which will allow for the formation of a low resistance electrode.

Next, as shown in FIG. 3D, sacrificial layer 322, polysilicon layer 320 and gate dielectric layer 318 are patterned with well known photolithography and etching techniques to form intermediate electrodes 324. At this time if desired, tip regions or lightly doped regions can be formed. For example, well known photolithography and ion implantation techniques can be used to form n type conductivity tip regions 326 in p type conductivity region 314 and p type conductivity tip regions 328 and n type conductivity region 316 in alignment with the outside edges of intermediate gate electrodes 324, as shown in FIG. 3D.

Next, a pair of sidewall spacers 330 are formed along opposite sides of intermediate gate electrode 324 as shown in FIG. 3E. Sidewall spacers 330 can be formed by any well known method such as by blanket depositing a 100–1000 Å thick conformal layer of silicon nitride over substrate 300 and then anisotropically etching the film to form sidewall spacers 330. Sidewall spacers 330 should be formed of a material which can be selectively etched with respect to sacrificial layer 322. Sidewall spacers 330 need not necessarily be single material spacers and can be composite spacers such as silicon nitride spacers with a thin oxide layer formed adjacent to the intermediate gate electrode 324. Sidewall spacers 330 have a height ($T_{sp}$) over substrate surface 301 which is equal to the combined thickness of polysilicon layer 320 ($T_g$) and sacrificial layer 322 ($T_{sac}$).

Next, if desired, substrate 300 can be etched in alignment with sidewall spacers 330 to form recesses 332 as illustrated in FIG. 3F. Recesses 332 are desirable when planar isolation regions 302 are used to isolate source/drain regions of adjacent devices. Recesses 332 can also be used when non planar isolation regions are used in order to provide increased margins for preventing silicide encroachment over the isolation region. Recesses 332 are formed to a depth beneath surface 301 sufficient to keep subsequently formed silicide beneath the top surface of isolation region 302. Recesses having a depth beneath surface 301 of between 100–1000 Å will generally be sufficient. Recesses 332 can be formed by any well known technique such as but not limited to reactive ion etching (RIE) with the chemistry comprising $C_2H_6$ and He at a ratio of 2:1. If a suitable spacer material is used, such as silicon nitride, recesses 322 can be formed by over etching into the silicon substrate 300 during the spacer etch.

Figure 3G:
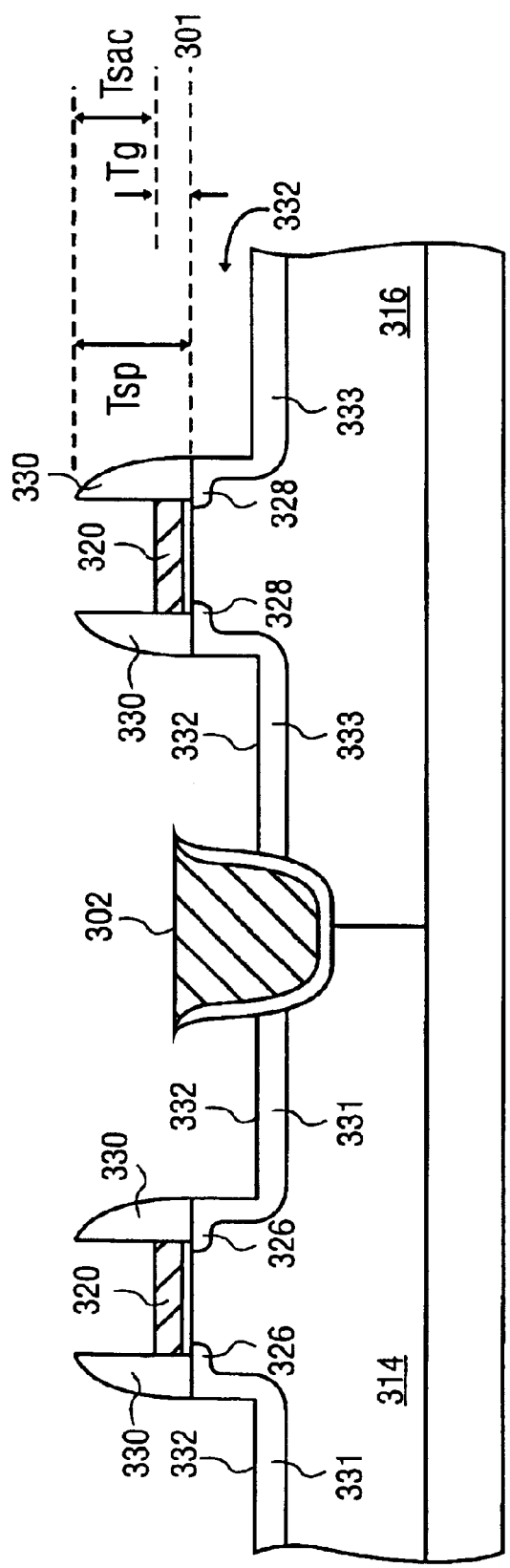
FIG. 3G is an illustration of a cross-section view showing the removal of the sacrificial layer from the substrate of FIG. 3F.

Next, as illustrated in FIG. 3G, sacrificial layer 322 is removed from polysilicon layer 320. If sacrificial layer 322 is an oxide, it can be removed with a diluted HF solution (50:1 H$_2$O to HF). If sacrificial layer 322 is silicon germanium it can be removed with a mixture of NH$_4$OH/H$_2$O$_2$ or sulfuric acid (H$_2$SO$_4$). Using a silicon germanium sacrificial layer 322 is advantageous because silicon germanium can be removed with an etchant which does not attack oxides which are generally used to fill STI region 302.

After sacrificial layer 322 has been removed, n type conductivity source/drain regions 331 and p type conductivity source/drain regions 333 can be formed as shown in FIG. 3G. N type source/drain regions 331 and p type source/drain regions 333 can be formed by well known photolithography and ion implementation techniques. If polysilicon layer 320 is made as thin as practically possible, (i.e., less than 1000 Å) the respective source/drain dopings will be able to dope the entire thickness of polysilicon layer 320, and thereby prevent polysilicon depletion effects. Additionally, by having a thin polysilicon layer, low energy (less than 30 Kev) source/drain implant energies can be used to form shallow source/drain junctions, and still ensure complete polysilicon doping. It is to be noted, that if desired deep source/drain regions 331 and 333 can be formed directly after spacer formation in FIG. 3E. Recesses 332 can then be subsequently etched into the source/drain regions 331 and 333.

Next, a silicide layer is formed on polysilicon layer 320 and on source/drain regions 331 and 333. In one embodiment of the present invention the silicide layers are formed with a self-aligned silicide process or SALICIDE process. In a salicide process, a metal layer 334 is blanket deposited over substrate 300 as illustrated in FIG. 3H. Metal layer 334 is generally a refractory metal such as but not limited to, titanium, tungsten, nickel, cobalt and palladium which can react with silicon to form a low resistance silicide. Metal layer 334 can be deposited by any well known technique such as by sputtering.

Substrate 300 is now annealed (heated) to cause a chemical reaction between those portions of metal layer 334 which are in direct contact with exposed silicon to form a silicide. That is, silicide is formed wherever silicon is available to react with metal layer 334 such as over source/drain regions 331 and 333 and on polysilicon gate electrode 320. Since no silicon is available from sidewall spacers 330 or on STI region 302 no silicide forms thereon. Substrate 300 is heated to a sufficient temperature and for a sufficient period of time in order to initiate the reaction and produce low resistance silicide. Substrate 300 can be thermally cycled with well known techniques such as a rapid thermal anneal or a furnace anneal. Next, substrate 300 is subjected to a etchant which selectively removes the unreactive portions of metal layer 334 while leaving silicide 336 on polysilicon layer 320 and on source/drain to regions 331 and 333.

It is to be appreciated that for preventing silicide encroachment on gate electrode 320, metal layer 334 is deposited to a thickness so that after the silicide reaction, spacers 330 extend above the formed silicide 336 and thereby confine the silicide layer between spacers 330. That is, metal layer 334 is deposited to a thickness so that after silicide formation the spacer height $T_{sp}$ is greater than the sum of a polysilicon gate thickness ($T_g$) plus the silicide thickness ($T_s$), (i.e., $T_{sp} > T_g + T_s$). Similarly, for preventing silicide encroachment over isolation region 302, metal layer 334 is deposited to a thickness so that after silicide reaction silicide layer 336 on source/drain regions 331 and 333 are beneath the top surface of isolation region 302. That is, silicide 336 on source/drain regions 331 and 333 has a height less than $T_{iso}$ over substrate surface 301 In this way silicide 336 is confined to the source/drain regions 331 and 333 between spacers 330 and isolation region 302.

It is to be appreciated that when volume expanding silicides are utilized, such as nickel silicide, additional margin should be provided to ensure that the silicide is unable to expand over spacers 330 and/or isolation region 302. The confining techniques of the present invention enable the use of volume expanding silicide layers without worrying about silicide encroachment problems associated with the prior art.

In an alternative to forming silicide 336 by a self-aligned process, silicide layer 336 can be selectively deposited onto source/drain regions 331 and 333 and polysilicon layer 320. For example, titanium silicide can be selectively deposited onto source/drain regions 331 and 333 and gate electrode 320 by chemical vapor deposition (CVD) using reactive gasses comprising TiCl$_4$, SiH$_2$Cl$_2$, and/or SiH$_4$ with a hydrogen carrier gas at a temperature ranging from 600–900° C. and a pressure between 5–100 torr. Such a process is said to be a selective process because it will form silicide only on exposed silicon surfaces, such as source/drain regions 331 and 332 and polysilicon gate electrode 320 and not on insulative regions such as spacers 330 or STI isolation region 302. It is recommended to utilize an HF dip prior to selective silicide deposition to ensure complete removal of all native oxide layers formed on silicon surfaces. A subsequent high temperature rapid thermal anneal can be used to convert the as deposited titanium silicide phase (C49) into low resistance phase (C54).

In a selective deposition process, insignificant amounts of silicon are consumed during the deposition as compared to a salicide process. Since less silicon is needed to support the silicide deposition, when a selective silicide process is used polysilicon layer 320 can be formed very thin to further decrease poly depletion effects and improve photolithography and etching processes.

It is to be appreciated that it may be desirable to selectively deposit semiconductor material prior to silicide formation. For example, after forming sidewall spacers 330 and recesses 332, and removing sacrificial layer 322 it may be desirable to selectively deposit a semiconductor material, such as silicon germanium, into recesses 332 and onto polysilicon layer 320 as shown in FIG. 4A. Ion implementation or insitu doping, can be used to dope the semiconductor material to the desired conductivity type and concentration. Additionally, a subsequent anneal step can be used to out diffuse dopants from the semiconductor material to form ultra shallow tip regions as discussed in U.S. patent application Ser. No. 08/363,749, filed Dec. 23, 1994. Additionally depositing additional semiconductor material on source/drain regions enables the manufacture of "raised" source/drain regions which reduce resistances of the device and improves performance. Silicide 336 is then subsequently formed on the deposited semiconductor material 400 as shown in FIG. 4B. In such a case, the deposited semiconductor material 400 combines with the previously deposited polysilicon layer 320 to set the gate electrode height ($T_g$). In such a case, sacrificial layer 322 should be made sufficiently thick to compensate for the additional volume occupied by the deposited semiconductor material 400.

It is to be appreciated that an advantage of the present method of confining silicide onto an electrode is the fact that it enables thin sidewall spacers (less than 300 Å wide) to be used. In prior art processes, spacers having a width of at least 2000 Å were required to ensure that they provided a sufficient gap or distance to prevent silicide encroachment. The use of thin spacers to confine silicide enables the further scaling of semiconductor devices. Additionally thin sidewall spacers allow solid source diffusion to be used to form ultra shallow tip regions since dopants have only a short distance (less than 300 Å) to diffuse underneath the gate electrode. Low resistance ultra shallow tips allow the fabrication of high performance semiconductor devices.

Thus, device structures and methods for preventing silicide encroachment have been described.

We claim:

1. A semiconductor device comprising:
    a gate electrode formed on a gate dielectric formed on a substrate surface, the gate electrode having a first thickness;
    a gate silicon germanium film formed on the gate electrode, the gate silicon germanium film having a second thickness;
    a gate silicide layer formed on the gate silicon germanium film, the gate silicide layer having a third thickness;
    a pair of sidewall spacers on opposite sides of the gate electrode, the sidewall spacers having a height of at least 200 Å above the third thickness of the gate silicide layer and a width of less than 300 Å;
    a pair of source and drain regions formed on opposite sides of said gate electrode, said source and drain regions having a silicon germanium film formed beneath said substrate surface and a pair of ultra shallow tip regions formed beneath the pair of sidewall spacers.

2. The semiconductor device of claim 1, wherein the gate electrode is polysilicon.

3. The semiconductor device of claim 1 further comprising:
    a silicide layer formed on the silicon germanium film of said source and drain regions.

4. The semiconductor device of claim 3 further comprising:
    an isolation region having a top surface positioned below the top surface of the silicon germanium film of said source and drain regions.

5. The semiconductor device of claim 3 further comprising: an isolation region having a top surface positioned below the silicide layer.

* * * * *

UNITED STATES PATENT AND TRADEMARK OFFICE
CERTIFICATE OF CORRECTION

PATENT NO. : 6,777,759 B1
DATED : September 1, 2004
INVENTOR(S) : Chau

It is certified that error appears in the above-identified patent and that said Letters Patent is hereby corrected as shown below:

<u>Column 4,</u>
Line 47, after "circuit" insert -- . --.

<u>Column 7,</u>
Line 52, after "source/drain" delete "to".
Line 67, after "301" insert -- . --.

Signed and Sealed this

Seventeenth Day of May, 2005

JON W. DUDAS
*Director of the United States Patent and Trademark Office*